United States Patent [19]
Staver

[11] Patent Number: 5,410,498
[45] Date of Patent: Apr. 25, 1995

[54] DECIMATION CIRCUIT AND METHOD FOR FILTERING QUANTIZED SIGNALS WHILE PROVIDING A SUBSTANTIALLY UNIFORM MAGNITUDE AND A SUBSTANTIALLY LINEAR PHASE RESPONSE

[75] Inventor: Daniel A. Staver, Scotia, N.Y.

[73] Assignee: General Electric Company, Schenectady, N.Y.

[21] Appl. No.: 223,196

[22] Filed: Apr. 5, 1994

[51] Int. Cl.$^6$ ............................................. G06F 15/31
[52] U.S. Cl. ................................................. 364/724.1
[58] Field of Search ...................... 364/724.1; 341/143; 375/96

[56] References Cited

U.S. PATENT DOCUMENTS

| | | | |
|---|---|---|---|
| 4,783,660 | 11/1988 | Pierce | 364/724.12 |
| 4,833,474 | 5/1989 | Nagai et al. | 364/724.1 |
| 4,896,156 | 1/1990 | Garverick | 341/143 |
| 4,951,052 | 8/1990 | Jacob et al. | 341/122 |
| 5,126,961 | 6/1992 | Garverick | 364/724.10 |
| 5,134,578 | 7/1992 | Garverick et al. | 364/752 |
| 5,181,033 | 1/1993 | Yassa et al. | 341/143 |
| 5,329,553 | 7/1994 | Abbiate et al. | 364/724.1 |
| 5,331,583 | 7/1994 | Hara et al. | 364/724.1 |

OTHER PUBLICATIONS

"A programmable Mixed-Signal ASIC for Power Meeting", S. L. Garverick, K. Fujjino, D. T. McGrath, R. D. Baertsch, IEEE Journal of Solid-State Circuits, vol. 26, No. 12, Dec. 1991, pp. 2008–2016.

"A Programmable Mixed Signal SIC For Power Management," D. McGrath, P. Jacob, H. Sailer, IEEE 1991 Custom Integrated Circuits Conf., 1992, pp. 19.4.1–19.4.3.

"Handbook of Digitial Signal Processing", Engineering Applications, Edited by D. F. Elliott, 1987, pp. 453–456.

"Digital Filters and Signal Processing", Leland B. Jackson, Available from Kluwer Academic Publishers Group, 1986, pp. 76–77.

"Oversampling Delta–Sigma Data Converters", J. C. Candy, G. C. Temes, IEEE Circuits and Systems Society, 1992, pp. 1–25.

*Primary Examiner*—Tan V. Mai
*Attorney, Agent, or Firm*—Enrique J. Mora; Marvin Snyder

[57] ABSTRACT

A decimation circuit for filtering a stream of quantized electrical signals while providing a substantially uniform magnitude and a substantially linear phase response over a predetermined passband range $F_B$ is provided. The stream of quantized electrical signals arrives at a predetermined rate $F_M$ from an oversampling delta-sigma modulator. The decimation circuit includes a decimation filter for filtering the stream of quantized electrical signals to provide a filtered output signal at an output rate $F_S$. The decimation filter has a frequency response defined by $$H(\omega) = \left[ \frac{\mathrm{Sin}(\omega RT/2)}{\mathrm{Sin}(\omega T/2)} \right]^k,$$

wherein k is a positive integer, T is the sampling period of the decimation filter and R is a decimation ratio defined by $R = F_M/F_S$. A magnitude corrector is coupled to the decimation filter to receive the filtered output signal and to correct the magnitude of the received filtered signal at least over the predetermined range $F_B$. The decimation ratio is selected such that output rate $F_S$ is sufficiently situated above bandpass range $F_B$ such that the magnitude corrector provides a desired substantially uniform magnitude and a substantially linear phase response over the passband range $F_B$.

14 Claims, 8 Drawing Sheets

DECIMATION CIRCUIT AND METHOD FOR FILTERING QUANTIZED SIGNALS WHILE PROVIDING A SUBSTANTIALLY UNIFORM MAGNITUDE AND A SUBSTANTIALLY LINEAR PHASE RESPONSE

RELATED APPLICATIONS

This application is related to U.S. patent application Ser. No. 08/223,195, entitled "Decimation Circuit and Method for Filtering Quantized Signals While Providing Phase Angle Correction With a Substantially Linear Phase Response," by D. A. Staver, filed concurrently with the present application, assigned to the assignee of the present invention and herein incorporated by reference.

BACKGROUND OF THE INVENTION

The present invention is generally related to decimation circuits used, for example, in oversampled delta-sigma analog-to-digital converters, and, in particular, to a decimation circuit and method for filtering quantized electrical signals while providing a substantially uniform magnitude and a substantially linear phase response at least over a desired passband range.

While data acquisition systems for generating digital data for the purposes of computation may receive analog input signals from a plurality of sensors, the analog signals must be digitized or quantized before they can be used by a computer as a basis for supporting computations. It is desirable to include respective analog-to-digital converters within the confines of an inexpensive single monolithic integrated circuit. Such data acquisition circuitry can be constructed using metal-oxide-semiconductor (MOS) integrated circuit technology and is suited for applications such as power metering and internal-combustion engine control.

Oversampling analog-to-digital converters of delta-sigma type are particularly economical of digital hardware. The use of such converter introduces the need for $\text{sinc}^k$ decimation filters, in which the kernel is a sampled-data representation of a suitable time-domain response, to achieve sufficient selectivity against harmonic components of the sinusoid being filtered. For example, for $k=1$ the time domain response corresponds to a rectangular time response, while for $k=2$, the time domain response corresponds to a triangular time response. In each case, the magnitude response of such $\text{sinc}^k$ filters generally introduces considerable attenuation over the high-end of a desired passband range. Although magnitude correctors have been suggested, in general such suggested magnitude correctors typically exhibit an undesirable nonlinear phase response over the bandpass range of interest. For example, L. B. Jackson, "Digital Filters and Signal Processing", 1986, available from Kluwer Academic Publishers, discusses in pages 76 and 77 various magnitude correctors, however, no suggestion is made of how to advantageously provide both a substantially uniform magnitude and a substantially linear phase response over the desired bandpass range. Thus it is desirable to provide a magnitude corrector capable of operating in a manner consistent with providing a substantially linear phase response over the passband range of interest.

SUMMARY OF THE INVENTION

Generally speaking, the present invention fulfills the foregoing needs by providing a decimation circuit for filtering a stream of quantized electrical signals while providing a substantially uniform magnitude and a substantially linear phase response over a predetermined passband range $F_B$. The stream of quantized electrical signals arrives at a predetermined rate $F_M$ from an oversampling delta-sigma modulator. The decimation circuit comprises a decimation filter for filtering the stream of quantized electrical signals to provide a filtered output signal at an output rate $F_S$. The decimation filter has a frequency response $H(\omega)$ defined by:

$$H(\omega) = \left[ \frac{\text{Sin}(\omega RT/2)}{\text{Sin}(\omega T/2)} \right]^k$$

wherein k is a positive integer, T is the sampling period of the decimation filter and R is a decimation ratio defined by $R=F_M/F'_S$. A magnitude corrector is coupled to the decimation filter to receive the filtered output signal and to correct the magnitude of the received filtered signal at least over the predetermined range $F_B$. The decimation ratio is selected such that output rate $F'_S$ is sufficiently situated above bandpass range $F_B$ such that the magnitude corrector provides a desired substantially uniform magnitude and a substantially linear phase response over the passband range $F_B$.

A method of operating a decimation circuit for filtering quantized signals arriving at a predetermined rate $F_M$ includes the steps of decimation filtering so as to provide a filtered output signal at an output rate $F'_S$ in accordance with a decimation ratio defined by $R=FM/F'_S$; selecting the decimation ratio such that output rate $F'_S$ is sufficiently situated above a desired bandpass range $F_B$ such that the magnitude corrector provides a desired substantially uniform magnitude and a substantially linear phase response over the passband range $F_B$; and correcting the magnitude of the filtered output signal at least over the passband range $F_B$.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

FIGS. 2a, 2b, and 2d illustrate exemplary power spectra associated with operations of the analog-to-digital converter of FIG. 1, while

DETAILED DESCRIPTION OF THE INVENTION

Conventional analog-to-digital conversion frequently involves use of oversampled analog-to-digital (A/D) converters. One example of such A/D converter is delta-sigma converter 100 illustrated in FIG. 1. Systems in which analog-to-digital converters and delta-sigma converters may prove useful are described in U.S. Pat. No. 5,181,033 entitled "Digital Filter for Filtering and Decimating Delta Sigma Modulator Output Signals," by Yassa et al., issued Jan. 19, 1993, U.S. Pat. No. 5,126,961, entitled "Plural-Channel Decimator Filter, as for Delta-sigma Analog-to-Digital Converters," by Carverick, issued Jun. 30, 1992, U.S. Pat. No. 5,134,578, entitled "Digital Signal Processor for Selectively Performing Cordic, Division or Square-Rooting Procedures," by Carverick et al., issued Jul. 28, 1992, U.S. Pat. No. 4,951,052, entitled "Correction of Systematic Error in the Oversampled Analog-to-Digital Converters," by Jacob et al., issued Aug. 21, 1990, and U.S. Pat. No. 4,896,156, entitled "Switched-Capacitance Coupling Network for Differential-Input Amplifiers Not Requiring Balanced Input Signals," by Garverick, issued Jan. 23, 1990, all of the foregoing patents assigned to the assignee of the present invention and herein incorporated by reference, and also described in "A Programmable Mixed Signal ASIC for Power Metering," by S. L. Garverick, K. Fujino, D. T. McGrath, and R. D. Baertsch, IEEE Journal of Solid State Circuits, Vol. 26, No. 12, December 1991, pp. 2008–16, and "A Programmable Mixed Signal ASIC for Power Management," by D. T. McGrath, P. Jacobs, and H. Sailer, IEEE 1992 Custom Integrated Circuits Conference, pp. 19.4.1 19.4.2, both of which are herein incorporated by reference.

Figure 1:
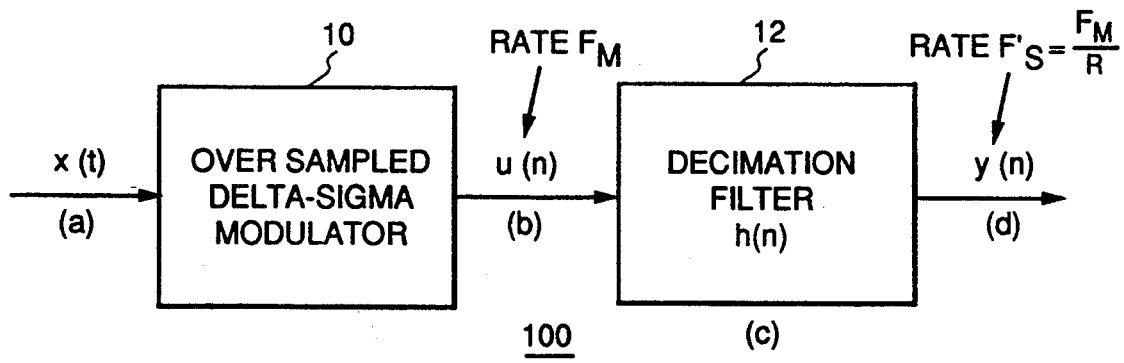
FIG. 1 is a block diagram showing a delta-sigma analog-to-digital converter which can conveniently incorporate a decimation circuit in accordance with the present invention.

The technique of oversampling is frequently used in performing analog-to-digital conversion. As shown in FIG. 1, delta-sigma analog-to-digital (A/D) converter 100 comprises an oversampled interpolative delta-sigma modulator 10 which is coupled to a low pass decimation filter 12. The role of modulator 10 is to spectrally shape the quantization noise of a low resolution analog-to-digital converter so that the quantization noise is predominantly concentrated at high frequency. The analog input signal x(t) to modulator 10 may comprise a main sinusoid situated in a relatively low frequency region (e.g., at about 60 Hz) and harmonics present over a bandpass frequency range having an upper bound $F_B$ (e.g., at about 1500 Hz). Since the lower bound of such frequency range is near direct current (DC), such frequency range is conveniently referred hereinafter as bandpass frequency range $F_B$. The main sinusoid and harmonics are sampled by modulator 10 at a relatively high sample rate $F_M$ (e.g., about 1.966 MHz). Subsequent low pass filtering and decimation can be used to remove the bulk of the quantization noise, resulting in a high resolution digital output signal at a reduced conversion rate $F_M/R$ where R is the decimation ratio, or ratio of the output clock rate $F'_S$ to the input clock or sample rate $F_M$. For a decimation ratio of 512, $F'_S$ is about 3.8 KHz which is sufficient to meet the Nyquist rate sampling requirements over bandpass frequency range $F_B$, that is, $F'_S$ is at least twice the highest spectral component expected over frequency range $F_B$.

In FIG. 1, the following functions are represented: input signal x(t), modulator output signal u(n) and filter output signal y(n) which constitutes the A/D converter output signal, along with the filter impulse response characteristics h(n). The corresponding frequency spectra X(f), U(f) and Y(f), and filter characteristics H(f), respectively are shown in FIGS. 2a, 2b, 2d and 2c and represent the conditions in the circuit of FIG. 1 at locations (a), (b), (d) and (c) respectively. It can be shown that a decimation filter which provides adequate attenuation for typical delta-sigma modulators comprises a frequency response given by:

$$H(\omega) = \left[ \frac{\operatorname{Sin}(\omega RT/2)}{\operatorname{Sin}(\omega T/2)} \right]^k \quad \text{(Eq. 1)}$$

wherein k is an integer that is chosen according to the order of the modulator. For example, it has been shown that a filter function having a value k=L+1 is close to being optimal for decimating the signal from delta sigma modulators of order L. See "Oversampling Delta-Sigma Data Converters, Theory Design and Simulation", edited by J. C. Candy and G. C. Temes, 1992, pp. 1–25, available from IEEE Press and which is herein incorporated by reference. In Eq. 1, T is the oversampling period.

Figure 2A:
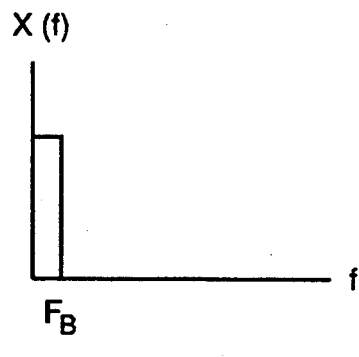
Figure 2B:
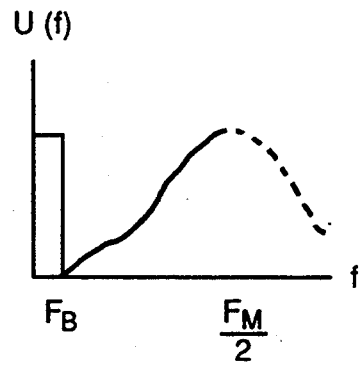
Figure 2C:
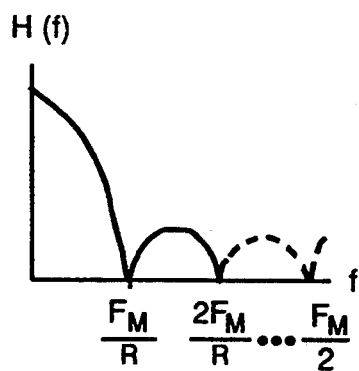
FIG. 2c and 2e represent typical filter characteristics for the decimation filter of FIG. 1.
Figure 2D:
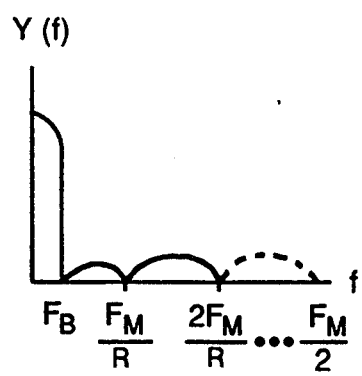
Figure 2E:
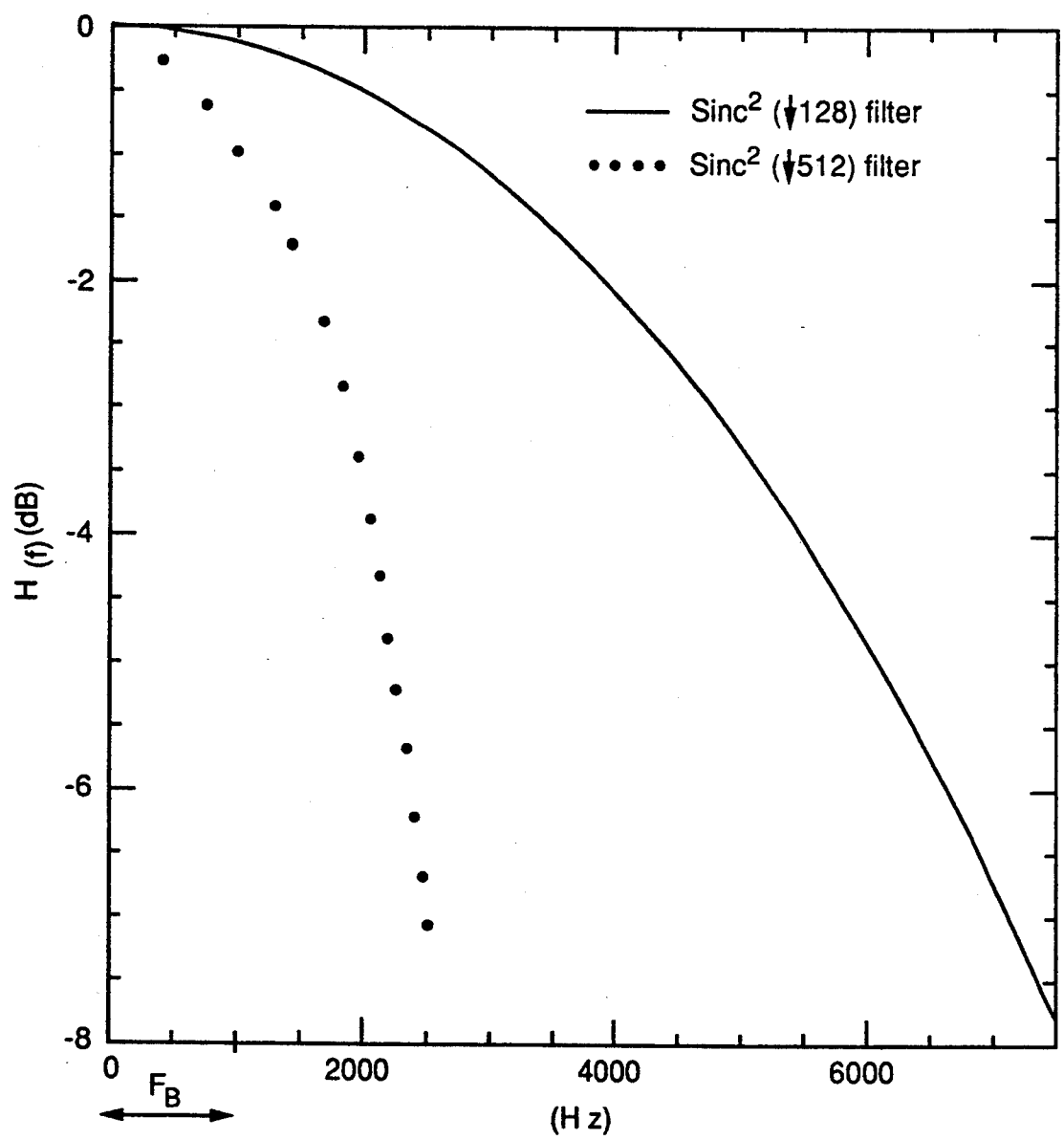

FIG. 2e shows in more detail that decimation filter 12 introduces significant magnitude attenuation or droop over bandpass range $F_B$. The dotted line represents an exemplary magnitude response for a $\operatorname{sinc}^2$ decimation filter having, for example, a decimation ratio R of 512 which as previously described satisfies the Nyquist rate sampling requirements over bandpass frequency range $F_B$. In the context of the invention the designation $\operatorname{sinc}^k$ is conveniently used to abbreviate the mathematical relationship defined by Eq. 1. The solid line represents a typical magnitude response for a $\operatorname{sinc}^2$ decimation filter having, for example, a decimation ratio R of 128. For this exemplary decimation ratio, $F'_S$ is about 15.36 KHz so as to provide an oversampling factor of at least four relative to the lowest sampling rate required to satisfy the Nyquist rate sampling requirements over bandpass frequency range $F_B$. Although such oversampling reduces the level of droop over the upper end of bandpass region $F_B$, the level of droop can still detrimentally affect the accuracy of signal measurements over the bandpass region.

Figure 3:
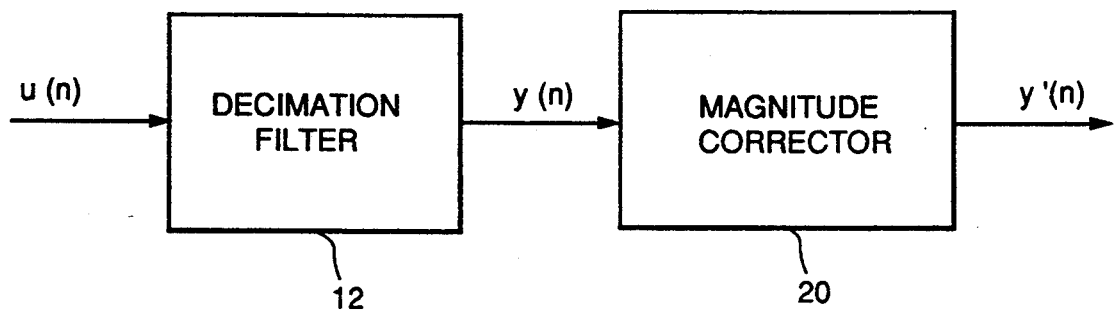
FIG. 3 is a block diagram of a decimation circuit with a magnitude corrector, in accordance with the present invention.

FIG. 3 shows that in accordance with an embodiment of the present invention, a magnitude corrector 20 is coupled to receive the output signal y(n) of decimation filter 12 so as to provide a magnitude corrected output signal y'(n). An important requirement, for magnitude corrector 20 is to provide a substantially linear phase response over the bandpass region $F_B$. Further, magnitude corrector 20, to reduce size and power requirements, should preferably be implemented with a minimum number of components. For example, a magnitude corrector not fulfilling the foregoing requirements would be difficult to incorporate in a single monolithic electronic integrated circuit chip for a delta-sigma converter.

Figure 4:
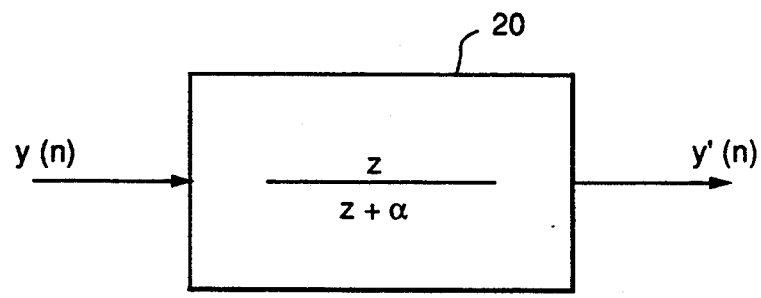
FIG. 4 illustrates the z domain transfer function for the magnitude corrector of FIG. 3.

FIG. 4 illustrates that magnitude corrector 20 can be conveniently selected as an infinite impulse response (IIR) digital filter having a z domain frequency response defined by $H(z)=z/(z+\alpha)$ wherein $|\alpha|<1$ for stability purposes. Further, as will be explained shortly hereafter, when such magnitude corrector is used in an oversampled environment, substantial magnitude correction is provided while maintaining a substantially linear phase response at least over the bandpass frequency range of interest.

Figure 5:
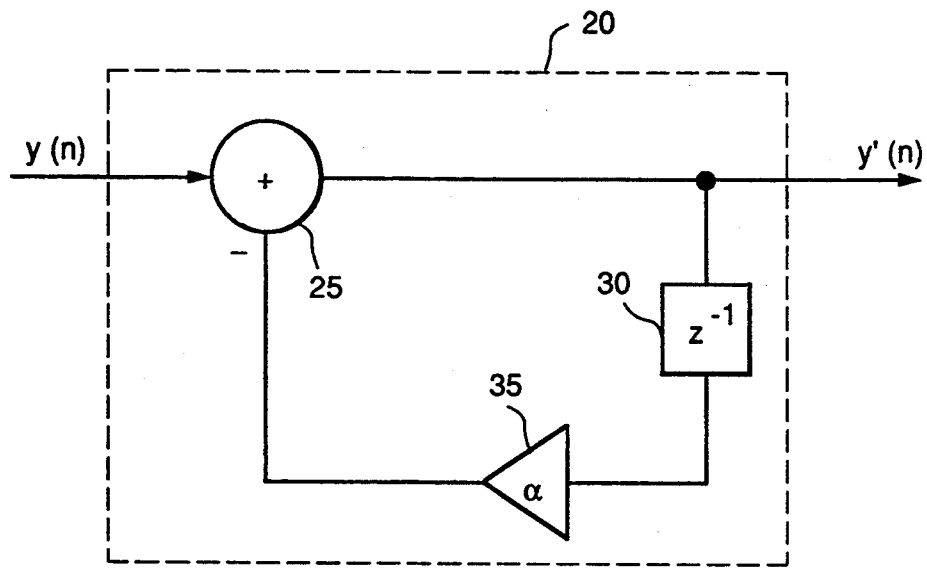
FIG. 5 is a block diagram showing an implementation for the magnitude corrector of FIG. 4.

FIG. 5 shows that magnitude corrector 20 can be advantageously constructed with relatively few components and thus another advantage of the present invention is its simplicity of implementation. A digital subtractor 25 receives the filtered output signal y(n) as a minuend input signal and receives a feedback signal as a subtrahend input signal so as to produce a difference output signal. A delay unit 30 receives the difference signal to produce a delayed difference output signal which is in turn received by a digital multiplier 35 having a multiplication factor substantially corresponding to the number $\alpha$. The output signal of the multiplier constitutes the subtrahend input signal and the difference output signal constitutes the output of the magnitude corrector. Preferably, digital multiplier 35 is a multibit floating point multiplier and digital subtractor 25 is a multibit floating point subtractor. The value for the number $\alpha$ is suitably selected depending on the particular implementation for a given decimation filter/magnitude corrector implementation.

Figure 6A:
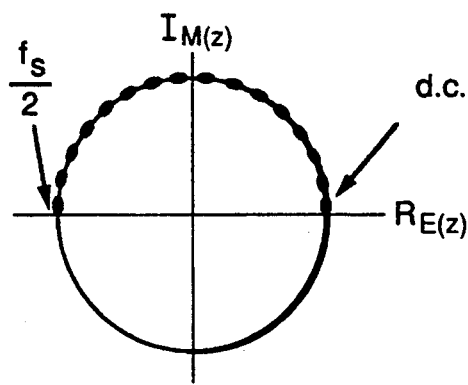
FIGS. 6a, 6b, and 6c illustrate exemplary z domain representations associated with operations of a magnitude corrector having the z domain transfer function in accordance with the present invention.
Figure 6B:
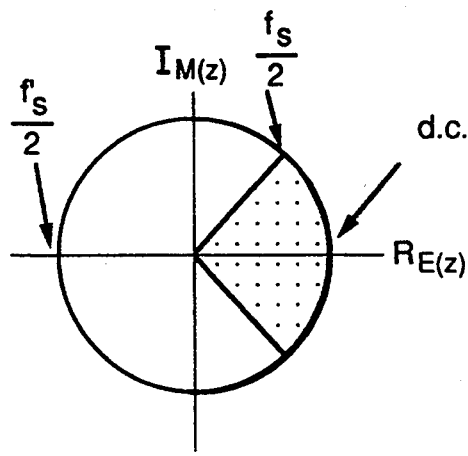
Figure 6C:
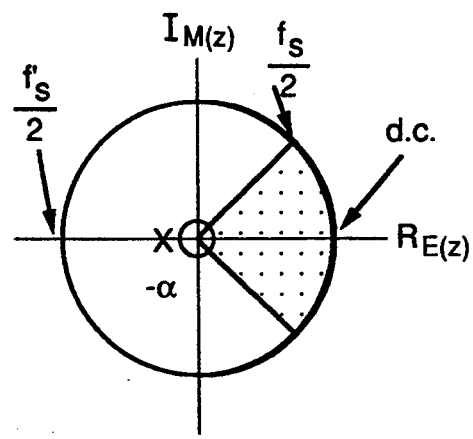

FIGS. 6a-6c illustrate a z plane representation which shows the advantageous results obtained in an oversampled environment in accordance with the present invention. FIG. 6a illustrates a nonoversampled environment wherein quantization data is acquired at a suitable sample rate $F_S$ so that the useful bandwidth is represented by the arc between the DC point and the half bandwidth point $F_S/2$. FIG. 6b illustrates an oversampled environment wherein quantization data is acquired at a suitable rate $F'_S$ and generally corresponding to a multiple of sample rate $F_S$. In the oversampled environment, the useful bandwidth is represented by the arc between the DC point and the point corresponding to the half bandwidth $F'_S/2$. In the example, illustrated in FIG. 6b an oversampling factor of four is depicted. As those skilled in the art will appreciate, the magnitude corrector introduces a pole located at $-\alpha$ and a zero located at the intersection of axes Im(z) and Re(z). It can be shown that the effect of the pole, for the oversampled case, is significantly less as compared to the non-oversampled case illustrated in FIG. 6a. Since such oversampling is directly related to decimation ratio R, a key advantage of the present invention is provided by selecting the decimation ratio such that output rate $F'_S$ is sufficiently situated above bandpass range $F_B$ to provide a desired substantially uniform magnitude and a substantially linear response over the predetermined passband range $F_B$. Thus, when operated in such oversampled environment, the magnitude corrector having the z domain response as described in the context of FIG. 3, conveniently and economically provides substantial magnitude correction while providing a substantially linear phase response over the bandpass frequency range $F_B$. It will be appreciated by those skilled in the art that in order to return to the baseband frequency range of interest, in such oversampled environment, additional suitable decimation circuitry (not shown) is conveniently employed subsequent to magnitude corrector 20 (FIG. 3). For instance, in the foregoing example, such additional decimation circuitry would provide a corresponding decimation factor of four in order to return to the bandpass frequency range of interest.

Figure 7A:
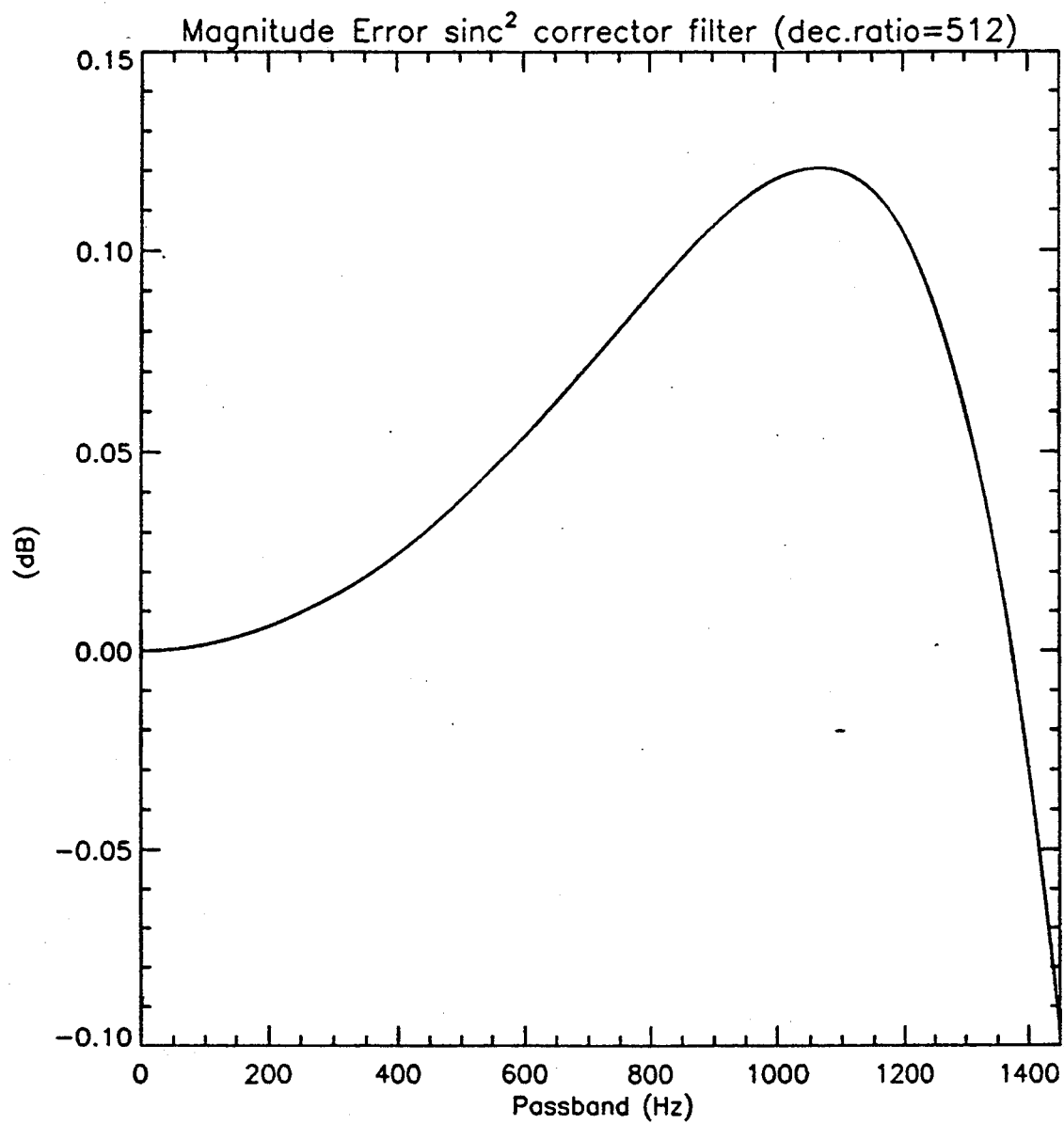
FIGS. 7a and 7b, respectively, illustrate magnitude and phase error in a nonoversampled environment and FIGS. 7c and 7d, respectively, illustrate magnitude and phase errors in an oversampled environment in accordance with the present invention.
Figure 7B:
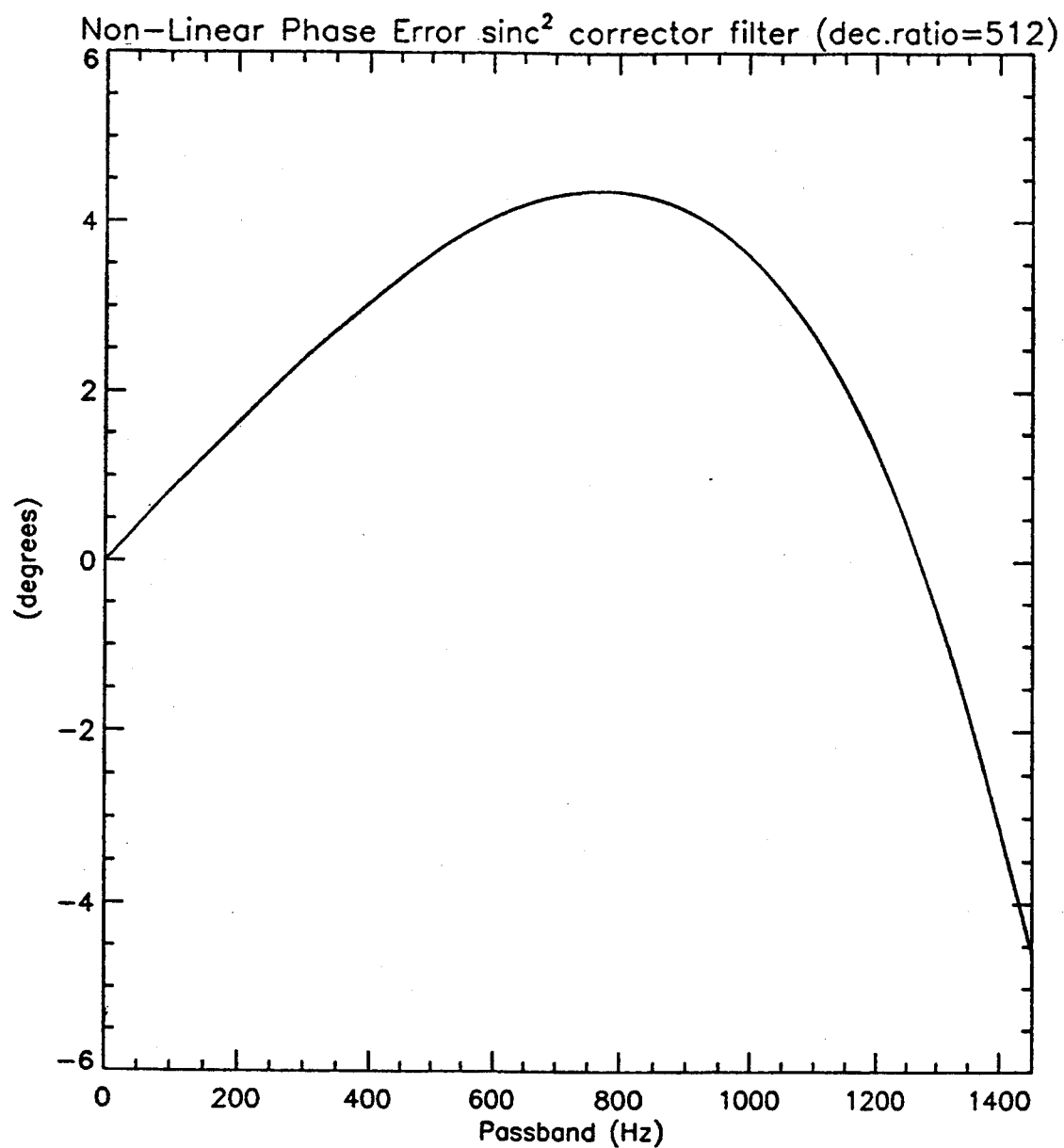
Figure 7C:
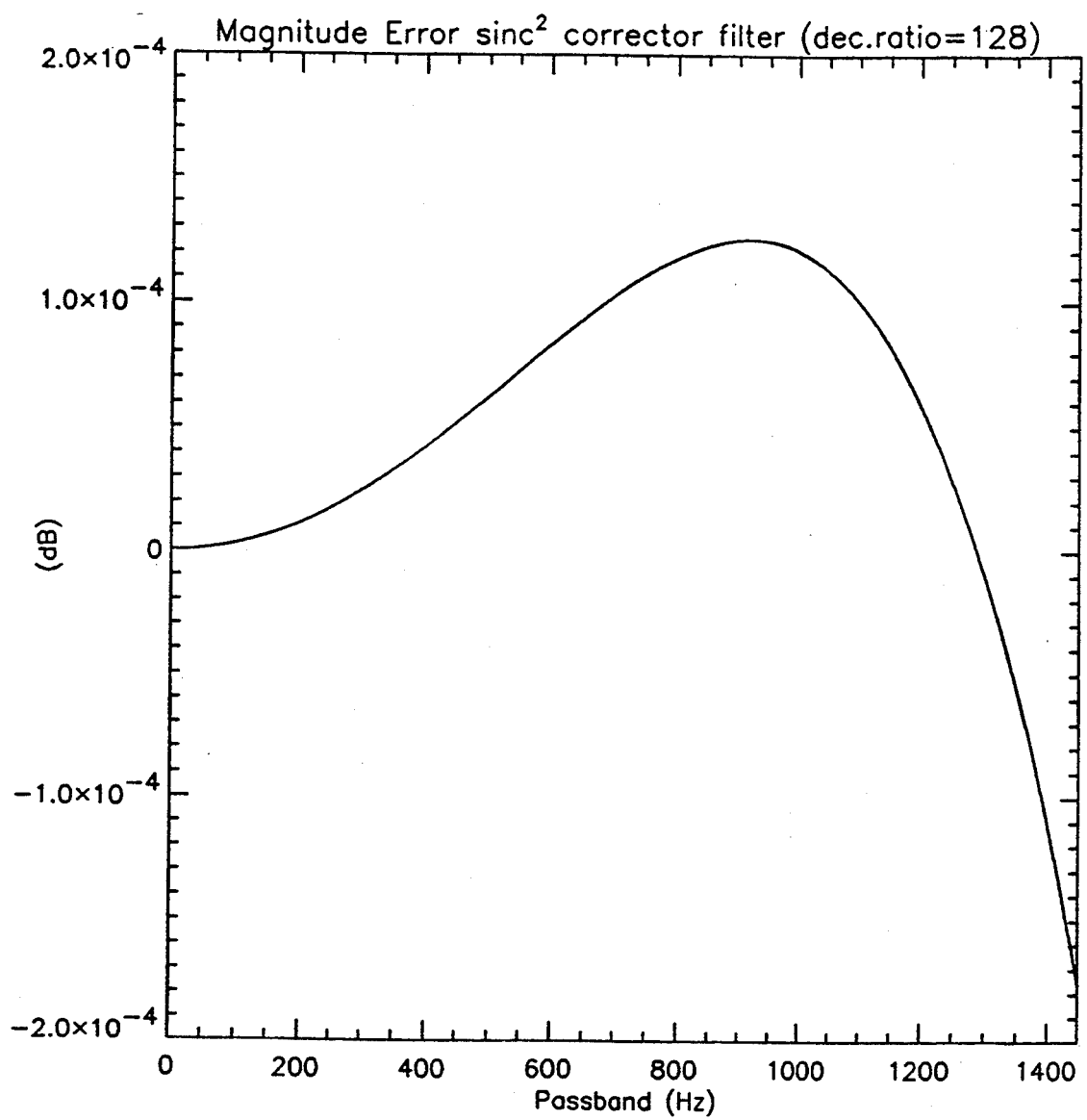
Figure 7D:
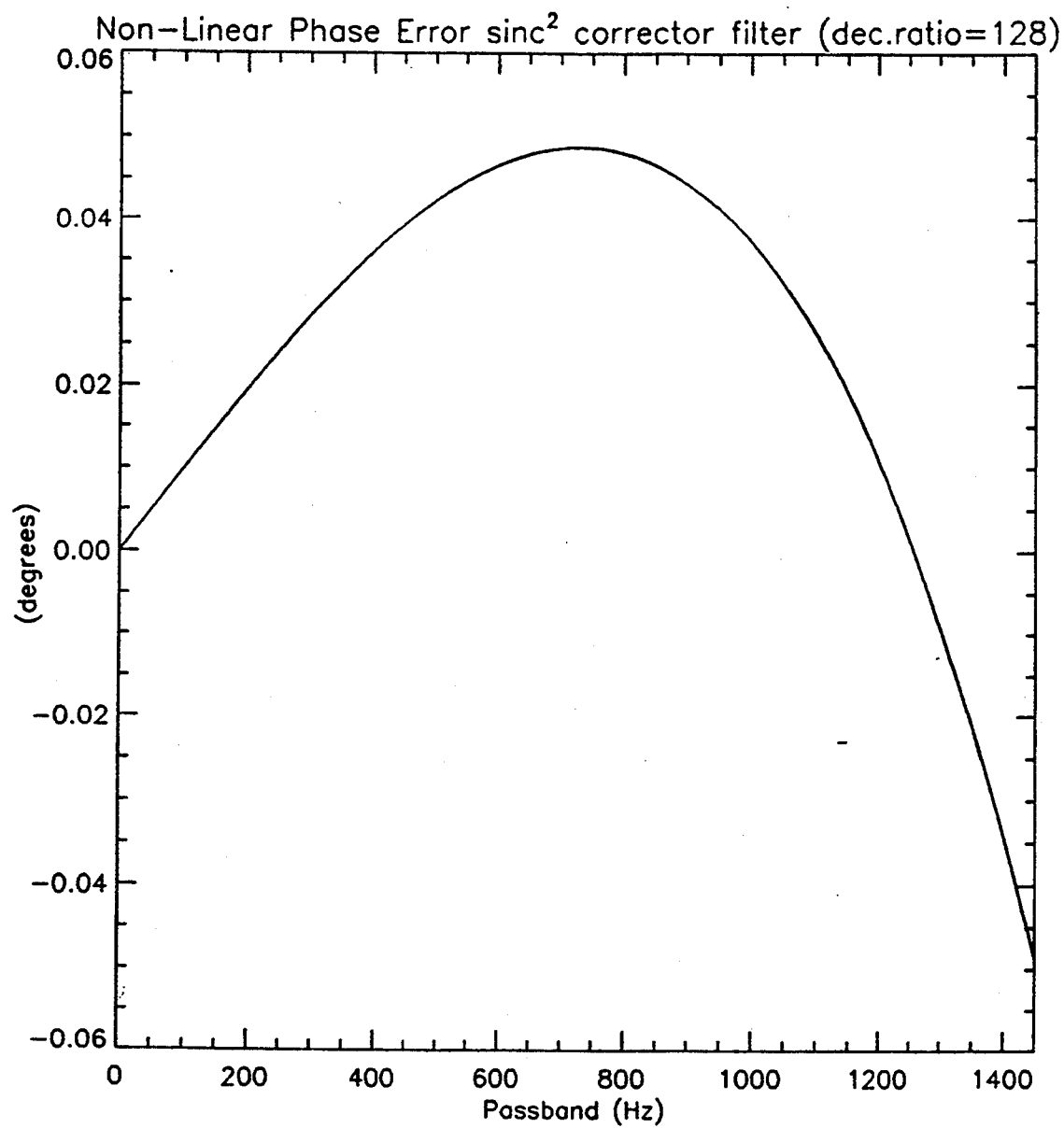

FIGS. 7a-7d show that the decimation circuit in accordance with the present invention, when operated in an oversampled environment, is capable of providing substantial magnitude correction and substantial linear phase response over the bandpass frequency $F_B$. For example, comparison of FIGS. 7a and 7c shows that the magnitude error for the decimation circuit is reduced by at least a factor of 500 when the decimation circuit is used in an oversampled environment. Similarly, comparison of FIGS. 7b and 7d shows that the non-linearity phase error is improved by at least a factor of 100 when the decimation circuit is used in an oversampled environment. In each case, for the sake of brevity of illustration, decimation filter 12 (FIG. 3) has an exemplary transfer function corresponding to a $sinc^2$ decimation filter.

A method of operating a decimation circuit in accordance with the present invention may include the steps of decimation filtering the stream of quantized electrical signals to provide a filtered output signal at an output rate $F'_S$ using a decimation filter having a frequency response defined by Eq. 1; selecting the decimation ratio such that output rate $F'_S$ is sufficiently situated above bandpass range $F_B$ so as to provide a desired substantially uniform magnitude and a substantially linear phase response over the passband range $F_B$; and correcting the magnitude of the filtered output signal at least over the passband range $F_B$.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A circuit for filtering a stream of quantized electrical signals from an analog-to-digital converter while providing a substantially uniform magnitude and a substantially linear phase response over a predetermined passband range $F_B$, said stream of quantized electrical signals having a predetermined rate $F_M$, said circuit comprising:

a decimation filter for filtering said stream of quantized electrical signals and adapted to provide a filtered output signal at an output rate $F'_S$, said decimation filter having a frequency response $H(\omega)$ defined by:

$$H(\omega) = \left[ \frac{\text{Sin}(\omega RT/2)}{\text{Sin}(\omega T/2)} \right]^k$$

wherein k is a positive integer, T is the sampling period of said decimation filter and wherein R is a decimation ratio defined by $R=F_M/F'_S$; and a magnitude corrector coupled to receive said filtered output signal to correct the magnitude of said filtered output signal at least over said predetermined passband range $F_B$.

2. The circuit of claim 1 wherein said magnitude corrector comprises an infinite impulse response (IIR)

digital filter having a z domain response H(z) defined by:

$$H(z) = \frac{z}{z + \alpha}$$

wherein $\alpha$ is a number such that $|\alpha| < 1$.

3. The circuit of claim 2 wherein said IIR digital filter comprises:
   a digital subtractor for receiving said filtered output signal from said decimation filter as a minuend input signal and for receiving a subtrahend feedback signal, said digital subtractor adapted to produce a difference output signal;
   a delay unit coupled to receive said difference output signal so as to produce a delayed difference signal; and
   a digital multiplier coupled to receive said delayed difference signal and adapted to multiply said delayed difference signal by a multiplying factor substantially corresponding to said $\alpha$ number, the output signal of said multiplier constituting said subtrahend feedback signal and the output signal of said subtractor constituting the output signal of said IIR filter.

4. The circuit of claim 3 wherein said digital multiplier comprises a multibit floating point multiplier.

5. The circuit of claim 3 wherein said digital subtractor comprises a multibit floating point subtractor.

6. The circuit of claim 1 wherein k equals one number of the group consisting of 1, 2 and 3 and said decimation ratio is selected such that output rate $F'_S$ is sufficiently situated above bandpass range $F_B$ such that said magnitude corrector provides a desired substantially uniform magnitude and a substantially linear phase over said predetermined passband range $F_B$.

7. The circuit of claim 1 wherein said analog-to-digital converter comprises an oversampled sigma-delta modulator.

8. A circuit for filtering a stream of quantized electrical signals from an oversampling delta-sigma modulator while providing a substantially uniform magnitude and a substantially linear phase response over a predetermined passband range $F_B$, said stream of quantized electrical signals having a predetermined rate $F_M$, said circuit comprising:
   a decimation filter for filtering said stream of quantized electrical signals and adapted to provide a filtered output signal at an output rate $F'_S$, said decimation filter having a frequency response $H(\omega)$ defined by:

$$H(\omega) = \left[ \frac{\text{Sin}(\omega RT/2)}{\text{Sin}(\omega T/2)} \right]^k$$

wherein k is a positive integer, T is the sampling period of said decimation filter and wherein R is a decimation ratio defined by $R = F_M/F'_S$; and
   a magnitude corrector coupled to receive said filtered output signal to correct the magnitude of said filtered output signal at least over said predetermined passband range $F_B$;
   said decimation ratio being selected such that output rate $F'_S$ is sufficiently situated above bandpass range $F_B$ such that said magnitude corrector provides a desired substantially uniform magnitude and a substantially linear phase over said predetermined passband range $F_B$.

9. The circuit of claim 8 wherein said magnitude corrector comprises an infinite impulse response (IIR) digital filter having a z domain response H(z) defined by:

$$H(z) = \frac{z}{z + \alpha}$$

wherein $\alpha$ is a number such that $|\alpha| < 1$.

10. The circuit of claim 9 wherein said IIR digital filter comprises:
   a digital subtractor for receiving said filtered output signal from said decimation filter as a minuend input signal and for receiving a subtrahend feedback signal, said digital subtractor adapted to produce a difference output signal;
   a delay unit coupled to receive said difference output signal so as to produce a delayed difference signal; and
   a digital multiplier coupled to receive said delayed difference signal and adapted to multiply said delayed difference signal by a multiplying factor substantially corresponding to said $\alpha$ number, the output signal of said multiplier constituting said subtrahend feedback signal and the output signal of said subtractor constituting the output signal of said IIR filter.

11. The circuit of claim 10 wherein said digital multiplier comprises a multibit floating point multiplier.

12. The circuit of claim 10 wherein said digital subtractor comprises a multibit floating point subtractor.

13. The circuit of claim 8 wherein k equals one number from the group consisting of 1, 2 and 3.

14. A method for filtering a stream of quantized electrical signals while providing a substantially uniform magnitude and a substantially linear response over a predetermined passband range $F_B$, said stream of quantized electrical signals arriving at a predetermined rate $F_M$ from an analog-to-digital converter, said method comprising:
   decimation filtering said stream of quantized electrical signals to provide a filtered output signal at an output rate $F'_S$ and having a frequency response $H(\omega)$ defined by:

$$H(\omega) = \left[ \frac{\text{Sin}(\omega RT/2)}{\text{Sin}(\omega T/2)} \right]^k$$

where k is a positive integer, T is a sampling rate and wherein R is a decimation ratio defined by $R = F_M/F'_S$;
   selecting said decimation ratio such that said output rate $F'_S$ is sufficiently situated above bandpass range $F_B$ to provide a desired substantially uniform magnitude and a substantially linear response over said predetermined passband range $F_B$; and
   correcting the magnitude of said filtered output signal at least over said predetermined passband range $F_B$.

* * * * *